United States Patent
Wu et al.

(10) Patent No.: US 9,773,451 B2
(45) Date of Patent: Sep. 26, 2017

(54) PIXEL CIRCUIT, METHOD FOR DRIVING PIXEL CIRCUIT AND DISPLAY APPARATUS

(71) Applicants: BOE TECHNOLOGY GROUP CO., LTD., Beijing (CN); CHENGDU BOE OPTOELECTRONICS TECHNOLOGY CO., LTD., Chengdu, Sichuan Province (CN)

(72) Inventors: Bo Wu, Beijing (CN); Xiaojing Qi, Beijing (CN); Wen Tan, Beijing (CN)

(73) Assignees: BOE TECHNOLOGY GROUP CO., LTD., Beijing (CN); CHENGDU BOE OPTOELECTRONICS TECHNOLOGY CO., LTD., Chengdu (CN)

(*) Notice: Subject to any disclaimer, the term of this patent is extended or adjusted under 35 U.S.C. 154(b) by 196 days.

(21) Appl. No.: 14/770,690

(22) PCT Filed: Oct. 20, 2014

(86) PCT No.: PCT/CN2014/088897
§ 371 (c)(1),
(2) Date: Aug. 26, 2015

(87) PCT Pub. No.: WO2016/011714
PCT Pub. Date: Jan. 28, 2016

(65) Prior Publication Data
US 2016/0365031 A1   Dec. 15, 2016

(30) Foreign Application Priority Data

Jul. 21, 2014   (CN) .......................... 2014 1 0347870

(51) Int. Cl.
*G09G 5/02* (2006.01)
*G09G 3/3258* (2016.01)
(Continued)

(52) U.S. Cl.
CPC ......... *G09G 3/3258* (2013.01); *G09G 3/3233* (2013.01); *G09G 3/3266* (2013.01);
(Continued)

(58) Field of Classification Search
CPC ............ G09G 3/3258; G09G 2320/043; H01L 27/3262; H01L 27/3211
(Continued)

(56) References Cited

U.S. PATENT DOCUMENTS

2004/0145547 A1* 7/2004 Oh ........................ G09G 3/3233
345/76
2006/0208975 A1* 9/2006 Ono ....................... G09G 3/3233
345/76
(Continued)

FOREIGN PATENT DOCUMENTS

CN           1494048 A      5/2004
CN         102163402 A      8/2011
(Continued)

OTHER PUBLICATIONS

Second Office Action regarding Chinese Application No. 201410347870.6 dated Jun. 29, 2016. Translation provided by Dragon Intellectual Property Law Firm.
(Continued)

*Primary Examiner* — Jonathan Blancha
(74) *Attorney, Agent, or Firm* — Harness, Dickey & Pierce, P.L.C.

(57) ABSTRACT

In the present disclosure, it is provided a pixel circuit including a plurality of rows of pixel units and a row-shared unit, wherein each row of pixel units includes a plurality of sub-pixel units, and the row-shared unit includes a plurality of row-driving light-emitting control modules. All of the plurality of sub-pixel units included in each row of pixel units is connected to a corresponding signal line. Each
(Continued)

row-driving light-emitting control module among the plurality of row-driving light-emitting control modules is connected to all of the sub-pixel units included in a corresponding one row of the pixel units among the plurality of rows of pixel units through the signal line, so as to provide a threshold compensation function.

12 Claims, 5 Drawing Sheets

(51) Int. Cl.
*G09G 3/3266* (2016.01)
*G09G 3/3275* (2016.01)
*H01L 27/32* (2006.01)
*G09G 3/3233* (2016.01)

(52) U.S. Cl.
CPC ........ *G09G 3/3275* (2013.01); *H01L 27/3211* (2013.01); *H01L 27/3262* (2013.01); *H01L 27/3265* (2013.01); *H01L 27/3276* (2013.01); *G09G 2300/0426* (2013.01); *G09G 2300/0465* (2013.01); *G09G 2300/0819* (2013.01); *G09G 2300/0852* (2013.01); *G09G 2300/0861* (2013.01); *G09G 2310/0262* (2013.01); *G09G 2320/043* (2013.01); *G09G 2320/045* (2013.01); *G09G 2320/0626* (2013.01)

(58) Field of Classification Search
USPC .......................................... 345/694
See application file for complete search history.

(56) References Cited

U.S. PATENT DOCUMENTS

| | | | |
|---|---|---|---|
| 2008/0174287 A1* | 7/2008 | Park | H02M 3/158 323/271 |
| 2009/0237332 A1 | 9/2009 | Choi | |
| 2012/0113161 A1* | 5/2012 | Hong | G09G 3/003 345/690 |
| 2012/0306843 A1* | 12/2012 | Wang | G09G 3/3258 345/212 |
| 2015/0199932 A1* | 7/2015 | Ohara | G09G 3/3233 345/212 |

FOREIGN PATENT DOCUMENTS

| | | |
|---|---|---|
| CN | 103295525 A | 9/2013 |
| CN | 203300194 U | 11/2013 |
| CN | 103700342 A | 4/2014 |
| CN | 103714778 A | 4/2014 |
| CN | 104157238 A | 11/2014 |
| CN | 203931451 U | 11/2014 |
| CN | 203950533 U | 11/2014 |
| KR | 20080059010 A | 6/2008 |

OTHER PUBLICATIONS

First Office Action regarding Chinese application No. 201410347870.6, dated Nov. 9, 2015. Translation provided by Dragon Intellectual Property Law Firm.
Written Opinion of the International Searching Authority for international application No. PCT/CN2014/088897.
Notification of Reexamination regarding Chinese Application No. 201410347870.6, dated Jul. 14, 2017. Translation provided by Dragon Intellectual Property Law Firm.

* cited by examiner

PIXEL CIRCUIT, METHOD FOR DRIVING PIXEL CIRCUIT AND DISPLAY APPARATUS

CROSS REFERENCE OF RELATED APPLICATION

This application is the U.S. national phase of PCT Application No. PCT/CN2014/088897 filed on Oct. 20, 2014, which claims a priority of the Chinese Patent Application No. 201410347870.6 filed on Jul. 21, 2014, the disclosures of which are incorporated in their entirety by reference herein.

TECHNICAL FIELD

The present disclosure relates to the field of display technology, in particular to a pixel circuit, a method for driving the pixel circuit, and a display apparatus.

BACKGROUND

As illustrated in FIG. 1A, a conventional pixel driving circuit of a typical active matrix/organic light-emitting diode (AMOLED) is implemented by a 2T1C pixel driving circuit, which includes a control transistor T, a driving transistor DTFT and a capacitor C, and is configured to drive the organic light-emitting diode (OLED). A gate electrode of the control transistor T is inputted with a control signal SW and the control transistor T is further connected to a data line DATA, a high level VDD is inputted to an anode of the OLED, and a low level is inputted to the driving transistor DTFT. Thus, the conventional 2T1C pixel circuit is quite simple in structure.

However, regarding a low temperature poly-silicon (LTPS) based AMOLED pixel driving circuit, there might be problems such as poor uniformity of threshold voltages, and thus a driving thin film transistor (TFT) threshold voltage compensation circuit is required to be integrated into the pixel driving circuit of the LTPS based AMOLED.

As illustrated in FIG. 1B, in a conventional design, a 5T2C pixel driving circuit or more TFTs and/or capacitors are required to implement the AMOLED pixel driving circuit with the threshold voltage compensation function. As illustrated in FIG. 1B, the 5T2C pixel driving circuit includes a first control transistor T1, a second control transistor T2, a third control transistor T3, a fourth control transistor T4, a first capacitor C1, a second capacitor C2 and a driving transistor DTFT, and is configured to drive the OLED. A control signal CR1 is inputted to a gate electrode of T1, a gate electrode of T2 and a gate electrode of T4. A gate electrode of T3 is connected to a scanning line SCAN, and a data voltage Vdata is inputted to T3. A first end of C1 is indicated by a reference A, and a second end of C1 is indicated by a reference B. The high level VDD is inputted to the DTFT. A low level VSS is inputted to a cathode of the OLED. With increasing of the number of the TFTs and/or capacitors, a larger and larger area in a layout region will be occupied, which may adversely affect on a decreasing of a size of the AMOLED pixel, and thus progress of an AMOLED pixel driving circuit with high pixel per inch (PPI) is restrained.

SUMMARY

(1) Technical Problems to be Solved

An object of the present disclosure is to provide a pixel circuit, a method for driving the pixel circuit and a display apparatus to increase an aperture ratio of a pixel, so as to reduce a current density of an organic light-emitting layer while implementing the display with uniformity.

(2) Technical Solutions

In one aspect of the present disclosure, it is provided a pixel circuit including a plurality of rows of pixel units and a row-shared unit, wherein each row of pixel units includes a plurality of sub-pixel units, and the row-shared unit includes a plurality of row-driving light-emitting control modules. All of the plurality of sub-pixel units included in each row of pixel units is connected to a corresponding signal line. Each row-driving light-emitting control module among the plurality of row-driving light-emitting control modules is connected to all of the sub-pixel units included in a corresponding one row of the pixel units among the plurality of rows of pixel units through the signal line, so as to provide a threshold compensation function.

Alternatively, the sub-pixel units are arranged in an effective display area, and the row-shared unit is arranged outside the effective display area.

Alternatively, each of the sub-pixel units included in an n-th row of pixel units includes a sub-pixel driving circuit and a light-emitting element, wherein n is an integer not greater than the total number of rows of the plurality of rows of pixel units included in the pixel circuit, and an (n−1)-th scanning line is an initial scanning line if n equals 1.

Alternatively, the sub-pixel driving circuit includes a driving compensation module, a data writing module and a driving transistor. A first electrode of the driving transistor is connected to a first end of the light-emitting element, a first level is inputted to a second electrode of the driving transistor, and a second end of the light-emitting element is connected to the signal line. The driving compensation module is connected to the (n−1)-th scanning line, a gate electrode of the driving transistor, the first electrode of the driving transistor, and the second electrode of the driving transistor respectively, inputted with a second level, and configured to control a gate-source voltage of the driving transistor to compensate a threshold voltage of the driving transistor when a scanning signal outputted by the (n−1)-th scanning line is effective during a first stage of a time period. The data writing module is connected to the n-th scanning line, a data line and the driving compensation module respectively, and configured to control a data voltage on the data line to be written into the gate electrode of the driving transistor by the driving compensation module when the scanning signal outputted by the n-th scanning line is effective during a second stage of the time period. Each of the row-driving light-emitting control module is inputted with a light-emitting control signal and the second level respectively, connected to the second end of the light-emitting element by the signal line respectively, and configured to control a level of the signal line to be the second level when the light-emitting control signal is effective during a third stage of the time period. When both the scanning signal outputted by the (n−1)-th scanning line and the scanning signal outputted by the n-th scanning line are ineffective during the third stage of the time period, the driving compensation module is further configured to maintain a level of the gate electrode of the driving transistor, so as to control the driving transistor to drive the light-emitting element to emit light and control the threshold voltage of the driving transistor to be compensated.

Alternatively, the driving compensation module includes a first compensation transistor, a second compensation transistor, a first capacitor and a second capacitor. A gate electrode of the first compensation transistor is connected to the (n−1)-th scanning line, a first electrode of the first compensation transistor is connected to a first end of the first capacitor, and a second electrode of the first compensation transistor is inputted with the first level. The gate electrode of the driving transistor is connected to the first end of the first capacitor, the first electrode of the driving transistor is connected to the first end of the light-emitting element, the second electrode of the driving transistor is inputted with the first level, and the second end of the light-emitting element is connected to the signal line. A gate electrode of the second compensation transistor is connected to the (n−1)-th scanning line, a first electrode of the second compensation transistor is connected to a second end of the first capacitor, and a second electrode of the second compensation transistor is connected to the first electrode of the driving electrode. A first end of the second capacitor is connected to the second end of the first capacitor, and a second end of the second capacitor is inputted with the second level.

Alternatively, the data writing module includes a data writing transistor, wherein a gate electrode of the data writing transistor is connected to the n-th scanning line, a first electrode of the data writing transistor is connected to the data line, and a second electrode of the data writing transistor is connected to the second end of the first capacitor.

Alternatively, each row-driving light-emitting control module includes a row-driving light-emitting control transistor, a gate electrode of which is inputted with the light-emitting control signal, a first electrode of which is inputted with the second level, and a second electrode of which is connected to the signal line.

Alternatively, all of the driving transistor, the first compensation transistor, the second compensation transistor, the data writing transistor and the row-driving light-emitting control transistor are N-type thin film transistors (TFTs).

In another aspect of the present disclosure, it is provided a method for driving the pixel circuit including: a compensation step: controlling, by a driving compensation module, a gate-source voltage of a driving transistor to compensate for a threshold voltage of the driving transistor when a scanning signal outputted by a previous row scanning line is effective during a threshold voltage compensation stage of a time period; a data writing step: controlling, by a data writing module, a data voltage on a data line to be written into a gate electrode of the driving transistor through the driving compensation module when a scanning signal outputted by a current row scanning line is effective during a data voltage compensation stage of the time period; and a light-emitting step: controlling, by a row-driving light-emitting control module, a level of the signal line to be a second level, and maintaining, by the driving compensation module a level of the gate electrode of the driving transistor, so as to control the driving transistor to drive the light-emitting element to emit light and control the threshold voltage of the driving transistor to be compensated, when a light-emitting control signal is effective and both the scanning signal outputted by the previous row scanning line and the scanning signal outputted by the current row scanning line are ineffective during a light-emitting stage of the time period.

In another aspect of the present disclosure, it is provided a display apparatus including the above pixel circuit.

(3) Advantageous Effects

The following advantageous effects may be obtained by at least one of the above technical solutions provided by the embodiments of the present disclosure:

In contrast to the conventional pixel circuit, the pixel circuit of the present disclosure includes the row-shared unit to decrease the number of TFTs within the effective display areas while compensating the threshold voltage of the driving transistor, and thus the aperture ratio of the pixel is increased. As a result, the current density of the organic light-emitting layer is reduced while the display with uniformity is implemented, and a service life of an AMOLED panel is extended.

BRIEF DESCRIPTION OF THE DRAWINGS

In order to illustrate the technical solutions of the present disclosure or the related art in a clearer manner, the drawings desired for the embodiments will be described briefly hereinafter. Obviously, the following drawings merely relate to some embodiments of the present disclosure, and based on these drawings, a person skilled in the art may obtain the other drawings without any creative effort.

DETAILED DESCRIPTION

Figure 1A:
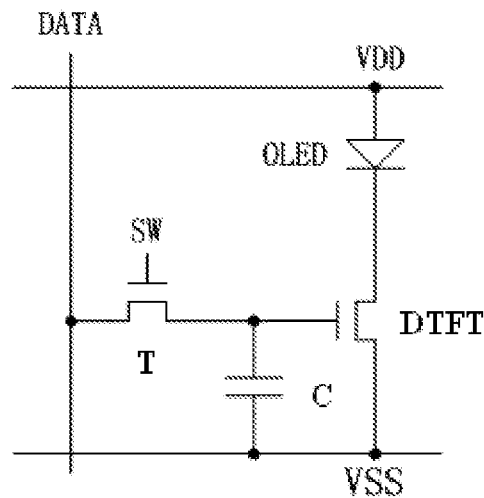
FIG. 1A is a circuit diagram of a conventional 2T1C pixel circuit.
Figure 1B:
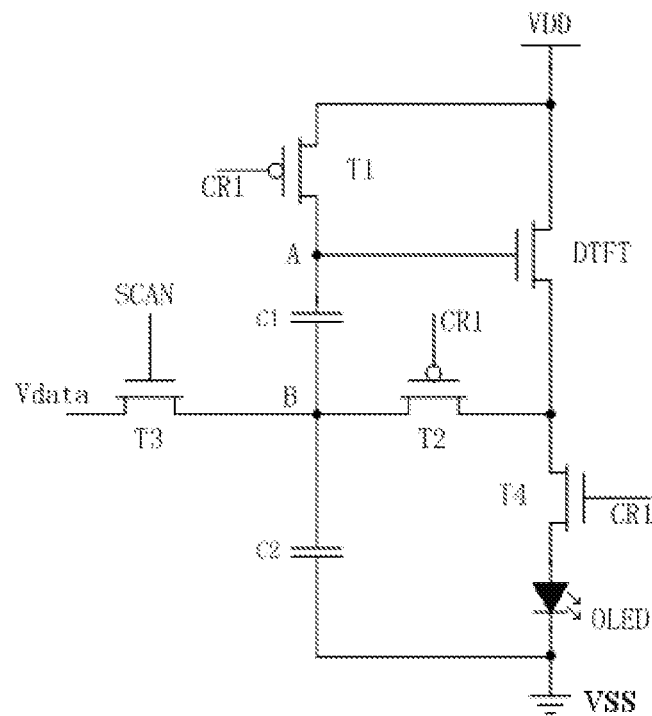
FIG. 1B is a circuit diagram of a conventional 5T2C pixel circuit.

The present disclosure will be described hereinafter in conjunction with the drawings and embodiments. The following embodiments are for illustrative purposes only, but shall not be used to limit the scope of the present disclosure.

In order to make the objects, the technical solutions and the advantages of the present disclosure more apparent, some technical solutions of the present disclosure will be described hereinafter in a clear and complete manner in conjunction with the drawings and embodiments. Obviously, the following embodiments are merely a part of, rather than all of, the embodiments of the present disclosure, and based on these embodiments, a person skilled in the art may obtain the other embodiments, which also fall within the scope of the present disclosure.

Unless otherwise defined, any technical or scientific term used herein shall have the common meaning understood by a person of ordinary skills Such words as "first" and "second" used in the specification and claims are merely used to differentiate different components rather than to represent any order, number or importance. Similarly, such words as "one" or "a/an" are merely used to represent the existence of at least one member, rather than to limit the number thereof.

Such words as "connect" or "connected to" may include electrical connection, direct or indirect, rather than to be limited to physical or mechanical connection. Such words as "on", "under", "left" and "right" are merely used to represent relative position relationship, and when an absolute position of the object is changed, the relative position relationship will be changed too.

The transistors adopted in all embodiments of the present disclosure may be thin film transistors, field effect transistors, or other similar transistors. In this embodiment of the present disclosure, for a purpose of distinguishing from each other, one of the two electrodes other than a gate electrode of the transistor may be a source electrode or a drain electrode, and the other one is a drain electrode or a source electrode. Furthermore, based on the characteristics of the transistors, the transistors may be categorized into N-type transistors and P-type transistors. With respect to the driving circuit according to the embodiment of the present disclosure, the explanations are made based on an assumption that all of the transistors are the N-type transistors, and those skilled in the art may easily implements the embodiments of the present disclosure without creative work if the P-typed transistors are adopted, which also falls within the protection scope of the present disclosure.

In the embodiment of the present disclosure, it is provided a pixel circuit including a plurality of rows of pixel units and a row-shared unit, wherein each row of pixel units includes a plurality of sub-pixel units. The row-shared unit includes a plurality of row-driving light-emitting control modules.

All of the plurality of sub-pixel units included in each row of pixel units is connected to a corresponding signal line.

Each row-driving light-emitting control module among the plurality of row-driving light-emitting control modules is connected to all of the sub-pixel units included in a corresponding one row of the pixel units among the plurality of rows of pixel units through the signal line, so as to provide a threshold compensation function.

In a particular embodiment, each of the sub-pixel units includes a sub-pixel driving circuit and a light-emitting element. The light-emitting element may be, for example, an OLED.

According to the embodiment of the present disclosure, the pixel circuit of the present disclosure includes the row-shared unit to decrease the number of TFTs within the effective display areas while compensating for the threshold voltage of the driving transistor, and thus the aperture ratio of the pixel is increased. As a result, the current density of the organic light-emitting layer is reduced while the display with uniformity is implemented, and a service life of an AMOLED panel is extended.

In the pixel circuit according to the embodiment of the present disclosure, not only the threshold voltage may be compensated, and the uniformity and the reliability are improved, but also the pixel driving circuit is simplified, and the number of control signals is reduced, which facilitates the decreasing of the size of the pixel.

In an embodiment, the sub-pixel units are arranged in an effective display area, and the row-shared unit is arranged outside the effective display area. The number of TFTs in the effective display area is further decreased and the aperture ratio is increased by arranging the circuit with commonality outside the effective display area in each row of pixel units.

More particular, each of the sub-pixel units included in an n-th row of pixel units includes a sub-pixel driving circuit and a light-emitting element, where n is an integer not greater than the total number of rows of the plurality of rows of pixel units included in the pixel circuit. For example, an (n−1)-th scanning line is an initial scanning line if n equals 1.

More particular, the sub-pixel driving circuit includes a driving compensation module, a data writing module and a driving transistor.

A first electrode of the driving transistor is connected to a first end of the light-emitting element, a second electrode of the driving transistor is inputted with a first level, and a second end of the light-emitting element is connected to the signal line.

The driving compensation module is connected to the (n−1)-th scanning line, a gate electrode of the driving transistor, the first electrode of the driving transistor, and the second electrode of the driving transistor respectively, inputted with a second level, and configured to control a gate-source voltage of the driving transistor to compensate for a threshold voltage of the driving transistor when a scanning signal outputted by the (n−1)-th scanning line is effective during a first stage of a time period.

The data writing module is connected to the n-th scanning line, a data line and the driving compensation module respectively, and configured to control a data voltage on the data line to be written to the gate electrode of the driving transistor by the driving compensation module when the scanning signal outputted by the n-th scanning line is effective during a second stage of the time period.

Each of the row-driving light-emitting control module is inputted with a light-emitting control signal and the second level respectively, connected to the second end of the light-emitting element through the signal line, and configured to control a level of the signal line to be the second level when the light-emitting control signal is effective during a third stage of the time period.

When both the scanning signal outputted by the (n−1)-th scanning line and the scanning signal outputted by the n-th scanning line are ineffective during the third stage of the time period, the driving compensation module is further configured maintain a level of the gate electrode of the driving transistor, so as to control the driving transistor DTFT to drive the OLED to emit light and control the threshold voltage of the driving transistor DTFT to be compensated.

More particular, in an embodiment of the present disclosure, it is provided a pixel circuit including L rows of pixel units, wherein each row of pixel units includes M sub-pixel units. Each of the M sub-pixel units included in the n-th row of the pixel units is connected to the n-th scanning line and the (n−1)-th scanning line (not shown in FIG. 2). A k-th sub-pixel unit included in each row of the pixel units is connected to a k-th data line. Both L and M are integers greater than 1, n is a positive integer not greater than L, and k is a positive integer not greater than M.

Figure 2:
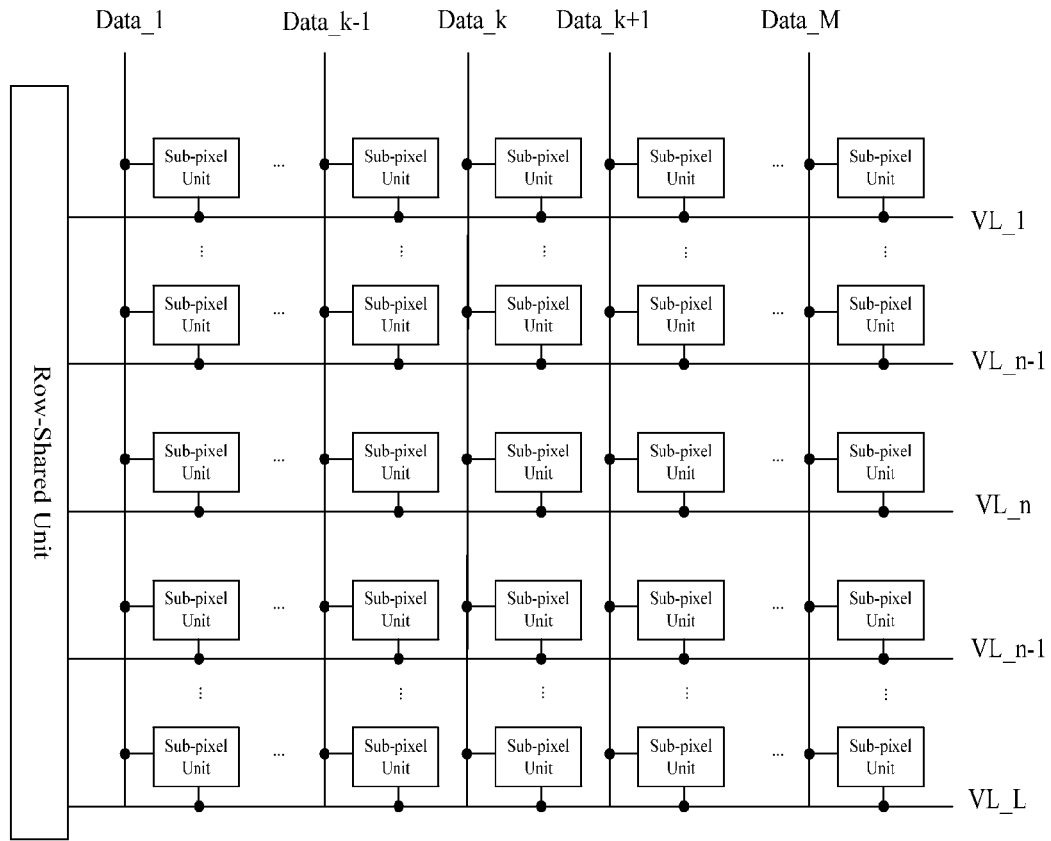
FIG. 2 illustrates a configuration of a pixel circuit according to an embodiment of the present disclosure.

As illustrated in FIG. 2, Data1 is a first data line, Data_k−1 is a (k−1)-th data line, Data_k is a k-th data line, Data_k+1 is a (k+1)-th data line, and Data_M is an M-th data line.

In FIG. 2, VL_1 is a signal line connected to the plurality of sub-pixel units included in a first row of pixel units, VL_n−1 is a signal line connected to the plurality of sub-pixel units included in an (n−1)-th row of pixel units, VL_n is a signal line connected to the plurality of sub-pixel units included in an n-th row of pixel units, VL_n+1 is a signal line connected to the plurality of sub-pixel units included in an (n+1)-th row of pixel units, and VL_L is a signal line connected to the plurality of sub-pixel units included in an L-th row of pixel units.

More particular, the following example is explained with taking a connection between the row-driving light-emitting control module included in the row-shared unit and a sub-pixel unit included in the n-th row of pixel units as an example.

Figure 3:
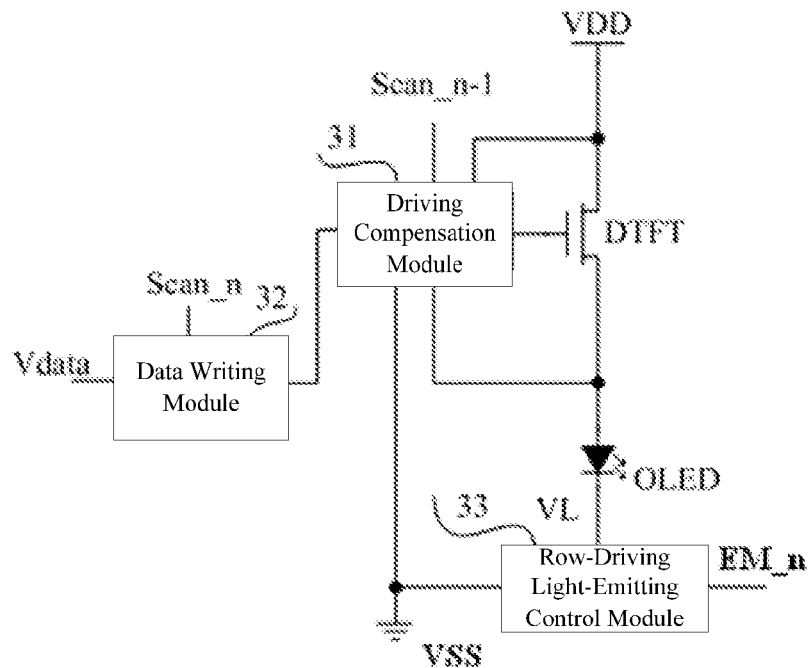
FIG. 3 is a block diagram illustrating a configuration of a sub-pixel unit and a row-driving light-emitting control module which are interconnected and included in the pixel circuit according to the embodiment of the present disclosure.

As illustrated in FIG. 3, the sub-pixel unit includes the sub-pixel driving circuit and the OLED. The sub-pixel driving circuit includes the driving transistor DTFT, the driving compensation module 31 and the data writing module 32.

A data voltage Vdata is outputted by a data line Data.

A first electrode of the driving transistor DTFT is connected to an anode of the OLED, and a second electrode of the driving transistor DTFT is connected to a high level VDD.

A cathode of the OLED is connected to a signal line VL.

The driving compensation module 31 is connected to a (n−1)-th scanning line Scan_n−1, a gate electrode of the driving transistor DTFT, the first electrode of the driving transistor DTFT, and the second electrode of the driving transistor DTFT respectively, inputted with a low level VSS, and configured to control a gate-source voltage of the driving transistor DTFT to compensate a threshold voltage Vth of the driving transistor DTFT when the scanning signal outputted by the (n−1)-th scanning line Scan_n−1 is effective during a first stage of a time period.

The data writing module 32 is connected to a n-th scanning line Scan_n, the data line Data and the driving compensation module 31 respectively, and configured to control the data voltage Vdata on the data line Data to be written to the gate electrode of the driving transistor DTFT by the driving compensation module 31 when the scanning signal outputted by the n-th scanning line Scan_n is effective during a second stage of the time period.

The row-driving light-emitting control module 33 is inputted with a light-emitting control signal EM_n and the low level VSS respectively, connected to the cathode of the OLED through the signal line VL respectively, and configured to control a level of the signal line VL to be the low level VSS when the light-emitting control signal EM_n is effective during a third stage of the time period.

When both the scanning signal outputted by the n-th scanning line Scan_n and the scanning signal outputted by the (n−1)-th scanning line Scan_n−1 are ineffective during the third stage of the time period, the driving compensation module 31 is further configured to maintain a level of the gate electrode of the driving transistor DTFT, so as to control the driving transistor DTFT to drive the OLED to emit light and control the threshold voltage of the driving transistor DTFT to be compensated.

In the embodiment as illustrated in FIG. 3, the DTFT is an N-type TFT. Those skilled in the art may understand that the present disclosure is not limited thereto.

Figure 4:
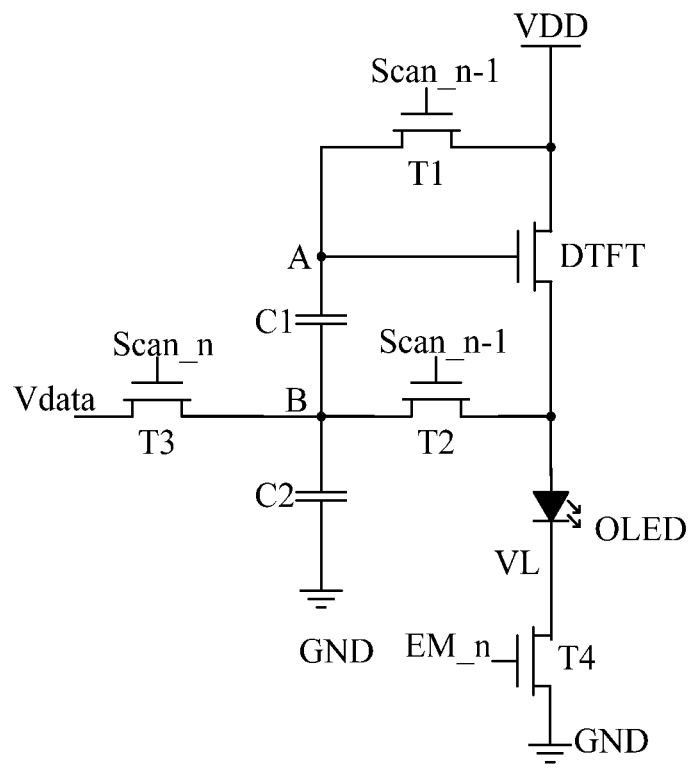
FIG. 4 is a circuit diagram of the sub-pixel unit and the row-driving light-emitting control module which are interconnected and included in the pixel circuit according to the embodiment of the present disclosure.

More particular, as illustrated in FIG. 4, the low level VSS may be a ground level GND.

The driving compensation module may include a first compensation transistor T1, a second compensation transistor T2, a first capacitor C1 and a second capacitor C2.

A gate electrode of the first compensation transistor T1 is connected to the (n−1)-th scanning line Scan_n−1, a first electrode of the first compensation transistor T1 is connected to a first end A of the first capacitor C1, and a second electrode of the first compensation transistor T1 is inputted with the high level VDD.

The gate electrode of the driving transistor DTFT is connected to a first end A of the first capacitor C1, the first electrode of the driving transistor DTFT is connected to the anode of the OLED, the second electrode of the driving transistor DTFT is inputted with the high level VDD.

The cathode of the OLED is connected to the signal line VL.

A gate electrode of the second compensation transistor T2 is connected to the (n−1)-th scanning line Scan_n−1, a first electrode of the second compensation transistor T2 is connected to a second end B of the first capacitor C1, and a second electrode of the second compensation transistor T2 is connected to the first electrode of the driving electrode DTFT.

A first end of the second capacitor C2 is connected to the second end B of the first capacitor C1, and a second end of the second capacitor C2 is inputted with the ground level GND.

The data writing module may include a data writing transistor T3, wherein a gate electrode of the data writing transistor T3 is connected to the n-th scanning line Scan_n, a first electrode of the data writing transistor T3 is connected to the data line Data, and a second end of the data writing transistor T3 is connected to the second end B of the first capacitor C1.

Each row-driving light-emitting control module may include a row-driving light-emitting control transistor T4, a gate electrode of which is inputted with the light-emitting control signal Em_n, a first electrode of which is inputted with the ground level GND, and a second electrode of which is connected to the signal line VL.

All of DTFT, T1, T2, T3 and T4 may be N-type TFTs.

In this embodiment of the present disclosure, all TFTs in the pixel circuit are N-type TFTs, which simplifies the manufacture procedure, and improves the yield rate.

In the embodiment as illustrated in FIG. 3, the sub-pixel unit including the DTFT, T1, T2, T3, C1, C2 and OLED is arranged within the effective display area, the row-driving light-emitting control module including T4 is arranged outside the effective display area, and all of the sub-pixel units in a same row of pixel units are connected to the row-driving light-emitting control module of the same row so as to implement the threshold compensation function.

The present disclosure is not limited to the above embodiments, and may be implemented as long as a row-shared unit including a plurality of row-driving light-emitting control modules is adopted to reduce the number of the TFTs within the effective display area, and thus decrease the size of the pixel.

Figure 5:
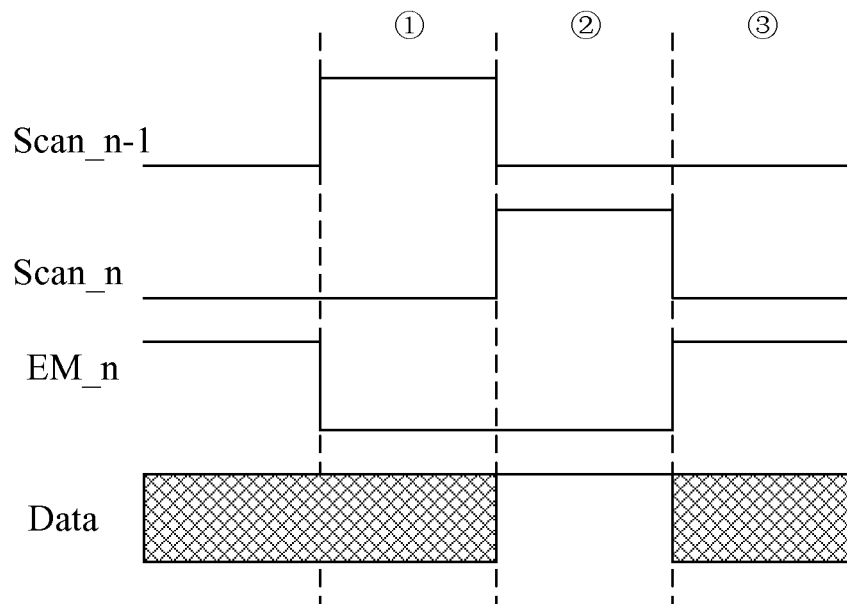
FIG. 5 is a workflow of the sub-pixel unit and the row-driving light-emitting control module being interconnected as illustrated in FIG. 4.

The workflow of the circuit as shown in FIG. 4 is illustrated in FIG. 5, which includes three stages.

Figure 6A:
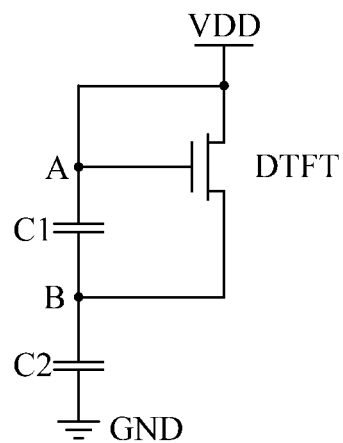
FIGS. 6A, 6B and 6C are equivalent circuit diagrams of the circuit as illustrated in FIG. 4 within a first stage, a second stage and a third stage respectively.

During a first stage (i.e. a threshold voltage compensation stage) of a time period, the Scan_n−1 outputs a high level, the Scan_n outputs a low level, the EM_n outputs a low level, the shared row-driving light-emitting control transistor T4 is turned off, the VL inside the pixel is in a floating state, and there is no conducting path for the OLED. Since the Scan_n−1 is of a high level, both T1 and T2 are turned on, and an equivalent circuit of the sub-pixel driving circuit is as illustrated in FIG. 6A. At this time, the DTFT is equivalent to a diode in a saturation state, C2 is charged by the VDD through the DTFT until a gate-source voltage of the DTFT (i.e. a difference VC1 between a potential VA of the first end A of C1 and a potential VB of the second end B of C1) equals to the threshold voltage Vth of the DTFT. The potential VA of the first end of C1 equals to VDD, and the potential VB of the second end B of C1 equals to VDD-Vth, so as to control the gate-source voltage of the DTFT to compensate for the threshold voltage Vth of the DTFT.

Figure 6B:
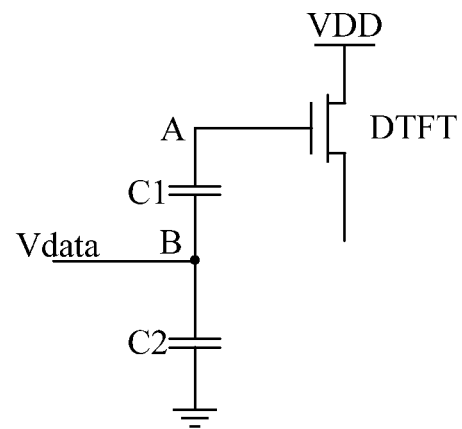

In a second stage (i.e. a data voltage writing stage) of the time period, the Scan_n−1 outputs a low level, the Scan_n outputs a high level, the EM_n outputs a low level, T4 is turned off, and the signal line VL is in a floating state. The Scan_n outputs a high level, T3 is turned on and an equivalent circuit to the sub-pixel driving circuit is as illustrated in FIG. 6B. The data voltage Vdata is written, VB=Vdata, a difference VC2 between the potential of the first end of C2 and the potential of the second end of C2=VB=Vdata. Since the voltage across C1 may not change abruptly, it is obtained that VA=VB+VC1=Vdata+Vth. At this time, since the VL is in a floating state, there is no conducting path for the OLED and the OLED does not emit light.

Figure 6C:
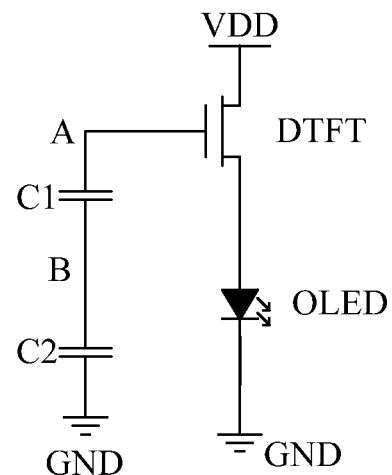

In a third stage (an OLED light-emitting stage) of the time period, the Scan_n−1 outputs a low level, the Scan_n outputs a low level, the EM_n outputs a high level, T4 is turned on, the data line VL is grounded through T4, a conducting path is formed along with the DTFT and the OLED, and a equivalent circuit to the sub-pixel driving circuit is as illustrated in FIG. 6C. All of T1, T2 and T3 are turned off, and there is no charging path or discharging path for C1 and C2, so that both the voltage across C1 and the voltage across C2 remain unchanged. VC2=Vdata, VC1=Vth, VB=Vdata, and thus VA=Vdata+Vth. The potential of the first end A of C1 remains unchanged, and thus the current I passing through the OLED equals to K(Vdata−Voled) 2, where K is a constant related to the manufacture process and the design. As a result, the obtained current for driving the OLED is irrelevant to the threshold voltage of the DTFT, and merely relevant to the Vdata.

Figure 7:
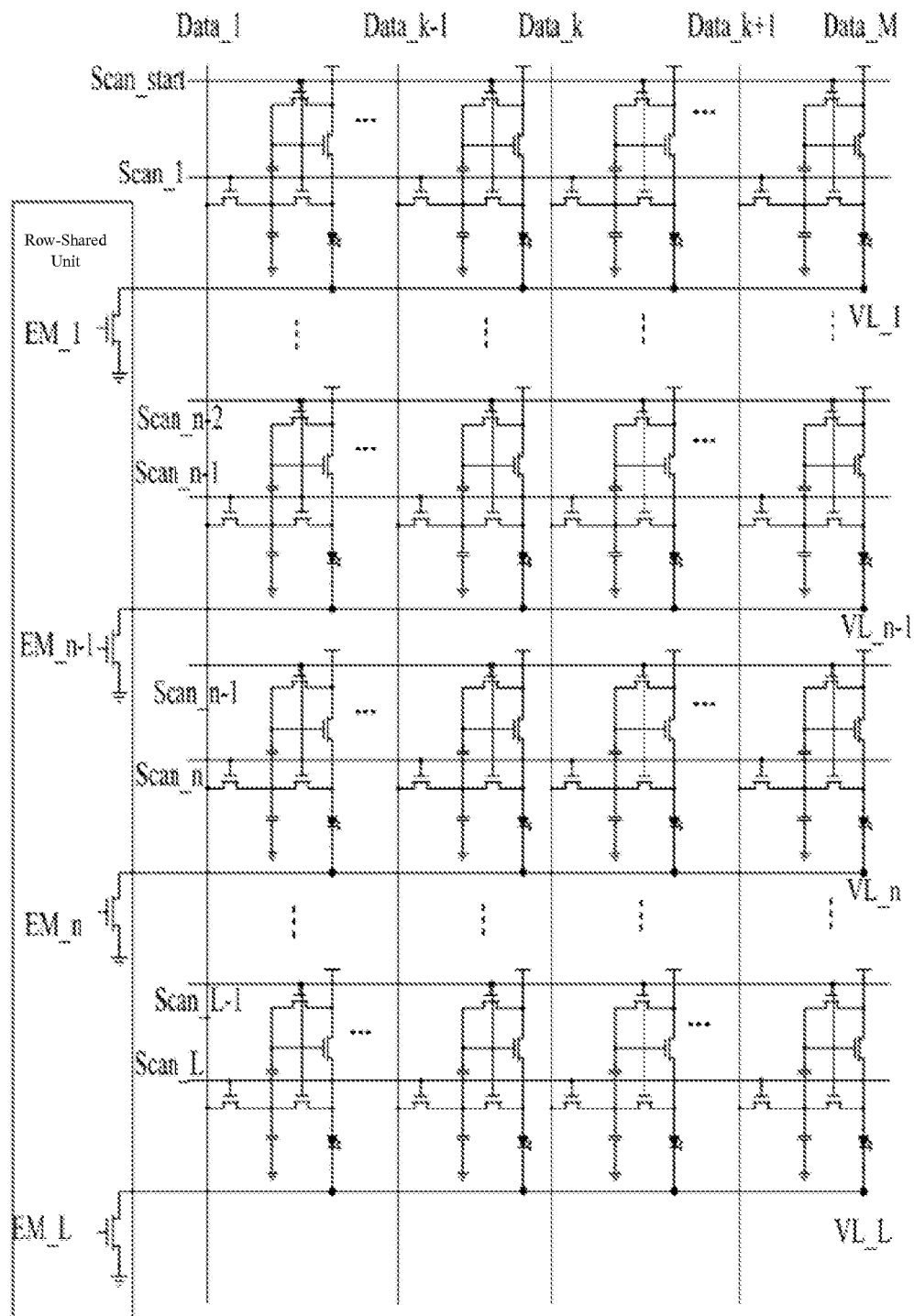
FIG. 7 is a circuit diagram of the pixel circuit according to the embodiment of the present disclosure.

FIG. 7 is a circuit diagram of the pixel circuit including the row-driving light-emitting control modules and the sub-pixel unit as illustrated in FIG. 4. As illustrated in FIG. 7, each row of pixel units shares the row-driving light-emitting control module on the left side, and the row-shared unit includes L row-driving light-emitting control modules.

A light-emitting control signal of a row-driving light-emitting control module of a first row of the pixel units is EM1, and an initial scanning line Scan_Start and a first scanning line Scan_1 are connected to the first row of pixel units.

A light-emitting control signal of a row-driving light-emitting control module of an (n−1)-th row of the pixel units is EM_n−1, and an (n−2)-th scanning line Scan_n−2 and an (n−1)-th scanning line Scan_n−1 are connected to the (n−1)-th row of pixel units.

A light-emitting control signal of a row-driving light-emitting control module of an n-th row of the pixel units is EM_n, and the (n−1)-th scanning line Scan_n−1 and an n-th scanning line Scan_n are connected to the n-th row of pixel units.

A light-emitting control signal of a row-driving light-emitting control module of an L-th row of the pixel units is EM_L, and an (L−1)-th scanning line Scan_L−1 and an L-th scanning line Scan_L are connected to the L-th row of pixel units.

As illustrated in FIG. 7, Data1 is a first data line, Data_k−1 is a (k−1)-th data line, Data_k is a k-th data line, Data_k+1 is a (k+1)-th data line, and Data_M is an M-th data line.

Both L and M are integers greater than 1, n is a positive integer not greater than L, and k is a positive integer not greater than M.

In another aspect of the present disclosure, it is provided a method for driving the pixel circuit including:

a compensation step: controlling, by a driving compensation module, a gate-source voltage of a driving transistor to compensate for a threshold voltage of the driving transistor when a scanning signal outputted by a previous row scanning line is effective during a threshold voltage compensation stage of a time period;

a data writing step: controlling, by a data writing module, a data voltage on a data line to be written into a gate electrode of the driving transistor through the driving compensation module when a scanning signal outputted by a current row scanning line is effective during a data voltage compensation stage of the time period; and a light-emitting step: controlling, by a row-driving light-emitting control module, a level of the signal line to be a second level, and maintaining, by the driving compensation module a level of the gate electrode of the driving transistor, so as to control the driving transistor to drive the light-emitting element to emit light and control the threshold voltage of the driving transistor to be compensated, when a light-emitting control signal is effective and both the scanning signal outputted by the previous row scanning line and the scanning signal outputted by the current row scanning line are ineffective during a light-emitting stage of the time period.

In yet another aspect of the present disclosure, it is provided a display apparatus including the above pixel circuit. The display apparatus may include liquid crystal display (LCD) apparatus, for example a LCD panel, a LCD TV, a mobile phone or a LCD monitor. Besides the LCD apparatus, the display apparatus may further include an OLED display or other types of display apparatus, for example an electronic reader or etc.

The optional embodiments of the present disclosure have been discussed. It is appreciated that many modifications and improvement may be made to the present disclosure without departing from the principle of the present disclosure for a person skilled in the art. These modifications and improvement should also be deemed to be fallen within the scope of the present disclosure.

What is claimed is:

1. A pixel circuit, comprising a plurality of rows of pixel units and a row-shared unit, wherein each row of the pixel units comprises a plurality of sub-pixel units, and the row-shared unit comprises a plurality of row-driving light-emitting control modules;

all of the plurality of sub-pixel units comprised in each row of pixel units are connected to a corresponding signal line; and each row-driving light-emitting control module among the plurality of row-driving light-emitting control modules is connected to all of the sub-pixel units comprised in a corresponding one row of the pixel units among the plurality of rows of pixel units through the signal line, so as to provide a threshold compensation function, wherein each of the sub-pixel units comprised in an n-th row of pixel units comprises a sub-pixel driving circuit and a light-emitting element, wherein n is an integer not greater than the total number of rows of the plurality of rows of pixel units comprised in the pixel circuit, and an (n−1)-th scanning line is an initial scanning line if n equals 1;

the sub-pixel driving circuit comprises a driving compensation module, a data writing module and a driving transistor;

a first electrode of the driving transistor is connected to a first end of the light-emitting element, a second electrode of the driving transistor is inputted with a first level, and a second end of the light-emitting element is connected to the signal line;

the driving compensation module is connected to the (n−1)-th scanning line, a gate electrode of the driving transistor, the first electrode of the driving transistor, and the second electrode of the driving transistor respectively, inputted with a second level, and configured to control a gate-source voltage of the driving transistor to compensate for a threshold voltage of the driving transistor when a scanning signal outputted by the (n−1)-th scanning line is effective during a first stage of a time period;

the data writing module is connected to the n-th scanning line, a data line and the driving compensation module respectively, and configured to control a data voltage on the data line to be written into the gate electrode of the driving transistor by the driving compensation module when the scanning signal outputted by the n-th scanning line is effective during a second stage of the time period; and each of the row-driving light-emitting control module is inputted with a light-emitting control signal and the second level respectively, connected to the second end of the light-emitting element through the signal line, and configured to control a level of the signal line to be the second level when the light-emitting control signal is effective during a third stage of the time period, the driving compensation module is further configured to maintain a level of the gate electrode of the driving transistor, so as to control the driving transistor to drive the light-emitting element to emit light and control the threshold voltage of the driving transistor to be compensated, when both the scanning signal outputted by the (n−1)-th scanning line and the scanning signal outputted by the n-th scanning line are ineffective during the third stage of the time period.

2. The pixel circuit according to claim 1, wherein the sub-pixel units are arranged in an effective display area.

3. The pixel circuit according to claim 2, wherein the row-shared unit is arranged outside the effective display area.

4. The pixel circuit according to claim 1, wherein the row-shared unit is arranged outside an effective display area.

5. The pixel circuit according to claim 1, wherein the driving compensation module comprises a first compensation transistor, a second compensation transistor, a first capacitor and a second capacitor;

a gate electrode of the first compensation transistor is connected to the (n−1)-th scanning line, a first electrode of the first compensation transistor is connected to a first end of the first capacitor, and a second electrode of the first compensation transistor is inputted with the first level;

the gate electrode of the driving transistor is connected to the first end of the first capacitor, the first electrode of the driving transistor is connected to the first end of the light-emitting element, the second electrode of the driving transistor is inputted with the first level, and the second end of the light-emitting element is connected to the signal line;

a gate electrode of the second compensation transistor is connected to the (n−1)-th scanning line, a first electrode of the second compensation transistor is connected to a second end of the first capacitor, and a second electrode of the second compensation transistor is connected to the first electrode of the driving electrode; and a first end of the second capacitor is connected to the second end of the first capacitor, and a second end of the second capacitor is inputted with the second level.

6. The pixel circuit according to claim 5, wherein the driving transistor, the first compensation transistor and the second compensation transistor are N-type thin film transistors (TFTs).

7. The pixel circuit according to claim 1, wherein the data writing module comprises
a data writing transistor, a gate electrode of which is connected to the n-th scanning line, a first electrode of which is connected to the data line, and a second electrode of which is connected to the second end of the first capacitor.

8. The pixel circuit according to claim 7, wherein the data writing transistor is an N-type TFT.

9. The pixel unit according to claim 1, wherein each row-driving light-emitting control module comprises
a row-driving light-emitting control transistor, a gate electrode of which is inputted with the light-emitting control signal, a first electrode of which is inputted with the second level, and a second electrode of which is connected to the signal line.

10. The pixel circuit according to claim 9, wherein the row-driving light-emitting control transistor is an N-type TFT.

11. A display apparatus comprising the pixel circuit according to claim 1.

12. A method for driving the pixel circuit according to claim 1, comprising steps of:
a compensation step: controlling, by a driving compensation module, a gate-source voltage of a driving transistor to compensate for a threshold voltage of the driving transistor when a scanning signal outputted by a previous row scanning line is effective during a threshold voltage compensation stage of a time period;
a data writing step: controlling, by a data writing module, a data voltage on a data line to be written into a gate electrode of the driving transistor through the driving compensation module when a scanning signal outputted by a current row scanning line is effective during a data voltage compensation stage of the time period; and
a light-emitting step: controlling, by a row-driving light-emitting control module, a level of the signal line to be a second level, and maintaining, by the driving compensation module a level of the gate electrode of the driving transistor, so as to control the driving transistor to drive the light-emitting element to emit light and control the threshold voltage of the driving transistor to be compensated, when a light-emitting control signal is effective and both the scanning signal outputted by the previous row scanning line and the scanning signal outputted by the current row scanning line are ineffective during a light-emitting stage of the time period.

* * * * *